(12) United States Patent
Nakasuji

(10) Patent No.: US 6,218,676 B1
(45) Date of Patent: Apr. 17, 2001

(54) CHARGED-PARTICLE-BEAM IMAGE-TRANSFER APPARATUS EXHIBITING REDUCED SPACE-CHARGE EFFECTS AND DEVICE FABRICATION METHODS USING THE SAME

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/326,483

(22) Filed: Jun. 4, 1999

(30) Foreign Application Priority Data

Jun. 5, 1998 (JP) .................................. 10-172115
Jul. 28, 1998 (JP) .................................. 10-226583

(51) Int. Cl.⁷ ............................. H01J 23/07; H01J 37/09
(52) U.S. Cl. .................................. 250/492.3; 250/492.2; 250/396 R; 315/5.31
(58) Field of Search ............................. 250/492.3, 492.2, 250/396 R; 315/5.31

(56) References Cited

U.S. PATENT DOCUMENTS 5,461,282 * 10/1995 Scheitrum et al. .................. 315/5.31
5,821,542    10/1998 Golladay .......................... 250/396 R
5,834,783    11/1998 Muraki et al. ...................... 250/398

* cited by examiner

*Primary Examiner*—Teresa M. Arroyo
*Assistant Examiner*—Nikita Wells
(74) *Attorney, Agent, or Firm*—Klarquist Sparkman Campbell Leigh & Whinston, LLP

(57) ABSTRACT

Charged-particle-beam ("CPB"; e.g., electron-beam) apparatus are disclosed that exhibit reduce image blur due to space-charge effects. With such apparatus, a reticle pattern can be imaged on a substrate with greater accuracy and higher throughput. Such results can be achieved using a charged-particle source having comparatively low emittance. An illumination-optical system directs an illumination beam from a CPB source to a reticle defining a pattern to be transferred to a substrate. A projection-optical system projection-images, on the substrate, an imaging beam that has passed through and been patterned by the reticle. The illumination-optical system includes a beam-shaping aperture that causes the illumination beam to have an annular transverse profile. The reticle is illuminated with an image of a crossover of the illumination beam. The CPB source desirably emits the illumination beam from an annular region of a cathode. Thus, the illumination beam has a substantially uniform intensity distribution in the vicinity of a crossover formed by the CPB source, and this crossover is imaged in a plane that is optically conjugate with the reticle.

16 Claims, 4 Drawing Sheets

CHARGED-PARTICLE-BEAM IMAGE-TRANSFER APPARATUS EXHIBITING REDUCED SPACE-CHARGE EFFECTS AND DEVICE FABRICATION METHODS USING THE SAME

FIELD OF THE INVENTION

This invention pertains to charged-particle-beam (e.g., electron-beam) microlithography apparatus and methods as used in the manufacture of semiconductor devices, displays, and the like. More specifically, the invention pertains to such methods and apparatus for transferring fine, high-density patterns with minimum linewidths of 0.1 μm or less at high throughput. Yet more specifically, the invention pertains to such methods and apparatus exhibiting reduced image blurring caused by space-charge effects, and to semiconductor-device fabrication methods that use such methods and apparatus.

BACKGROUND OF THE INVENTION

As used herein, a "charged particle beam" is a beam of charged particles such as electrons or ions. For simplicity, the following discussion is in the context of an electron beam; however, it will be understood that the principles of the invention can be applied with equal facility to other types of charged particle beams.

In a conventional electron-beam microlithography apparatus, an electron beam is produced by an electron gun. The electron beam passes through an "illumination-optical system" to illuminate a portion of a patterned reticle. The reticle defines the pattern (e.g., a layer of an integrated circuit) to be transferred to a sensitized substrate (e.g., semiconductor wafer). The beam between the electron gun and the reticle is termed an "illumination beam." After passing through the illuminated portion of the reticle, the beam (now termed an "imaging beam" or "patterned beam") passes through a "projection-optical system" to form a corresponding image on the surface of the substrate. The substrate surface is "sensitized" by a previously applied layer of a suitable resist that is responsive in an image-forming way to exposure to charged particles of the imaging beam. For exposure, the dosage of charged particles impinging on the surface of the substrate can be increased or decreased by increasing or decreasing, respectively, the beam current.

In electron-beam microlithography systems, if the beam current is increased (e.g., in an effort to increase throughput), the electron density in the beam is correspondingly increased, which results in correspondingly increased Coulomb repulsion between electrons in the beam. Such Coulomb repulsion, also termed a "space-charge effect," causes the beam to spread out, which causes blurring of the image transferred by the beam.

Certain types of electron-beam microlithography apparatus are termed "critical illumination" systems in which an enlarged image of a crossover produced by the electron gun is formed on a downstream beam-shaping aperture in the illumination-optical system. In conventional illumination-optical systems intended for critical illumination, the transverse intensity profile of the electron beam (i.e., intensity profile of the beam in a plane perpendicular to the optical axis of the illumination-optical system or projection-optical system) exhibits a Gaussian distribution. In the Gaussian distribution of the beam in conventional systems, the center of the beam has the highest intensity, with intensity falling off rapidly with increasing distance from the beam center.

For example, the portion of the beam at the center of the distribution where the beam intensity is flat to within ±1 % has a diameter of ⅛ or less of the total beam diameter. As a result, with critical illumination, an exposure area that is the same as that obtainable with Köhler illumination cannot be obtained without increasing the current supplied to the electron gun. But, as noted above, increasing the gun current increases the beam current, which increases space-charge effects. (In a Köhler illumination system, the beam diverging from a crossover is incident to a field-limiting aperture, and the crossover is imaged in the entrance pupil of the projection-optical system.)

A beam having a Gaussian intensity distribution with a center peak intensity is termed a "solid" beam. In a solid beam, space-charge effects are a major problem.

"Hollow" beams are known. According to the reference Ura, Katsumi, *Electron Optics*, Kyoritsu, 1979, a hollow beam exhibits less beam spreading due to space-charge effects. A hollow electron beam can be generated, for example, using an electron gun having a frusto-conical cathode, wherein the conical surface of such a cathode is the electron-emitting surface. A gun crossover typically is located just downstream of the cathode of such an electron gun. The current density at the gun crossover of an electron gun with a frusto-conical cathode exhibits a Gaussian distribution. Certain of such electron guns also have an associated gun lens. So long as aberrations generated by the gun lens are small, the angular distribution of the electron beam emerging from the crossover will be characteristic of a hollow beam. If the gun lens or any other portion of the electron gun exhibits excessive aberration, however, the edges of the beam-intensity distribution become blurred, producing a beam that is no longer clearly hollow. Such aberrations are extremely difficult to correct or control at the gun. Even though a blurred hollow beam can be shaped to some extent by passing the beam through an annular aperture, this remedy alone is inadequate for forming the desired quality of hollow beam. In addition, attempting to "correct" a blurred beam using an annular aperture in such a manner results in blocking a large proportion of the beam from propagating downstream of the annular aperture to, e.g., the reticle. Consequently, a very large beam current is required which further aggravates space-charge effects and causes an excessive temperature rise of the annular aperture.

With certain conventional electron-beam microlithography systems, the reticle pattern is divided into multiple exposure units (e.g., stripes, subfields, or the like, wherein an "exposure unit" is the area on the reticle that is illuminated, and thus exposed, by the beam at any given instant of time). Each exposure unit defines a respective portion of the overall pattern defined by the reticle. The exposure units typically exhibit differing feature densities from one exposure unit to another and can exhibit substantial differences in feature density within individual exposure units. Differences in feature density result in corresponding differences in downstream beam current. As a result, under such conditions, points of best focus of the beam at the substrate are not in the same plane.

SUMMARY OF THE INVENTION

The present invention was derived so as to solve the problems of conventional systems summarized above. More specifically, apparatus according to the invention exhibit, inter alia, reduced image blurring due to space-charge effects. Apparatus according to the invention also allow larger exposure units of the reticle to be exposed per "shot,"

even using an electron-beam source having a comparatively low emittance (an emittance of no more than approximately 1 mm·mrad). Hence, microlithographic pattern transfer can be performed with greater accuracy and throughput than with conventional systems.

According to one aspect of the invention, apparatus are provided for performing a microlithographic transfer of a pattern, defined by a reticle, to a substrate using a charged particle beam (e.g., electron beam). A representative embodiment of such an apparatus comprises, along an optical axis, an illumination-optical system and a projection-optical system. The illumination-optical system directs an electron illumination beam to the reticle so as to illuminate an exposure unit of the reticle with the illumination beam. The illumination-optical system also forms an imaging beam from electrons of the illumination beam passing through the illuminated exposure unit. The projection-optical system is situated downstream of the illumination optical system and includes a contrast aperture. The projection-optical system projects the imaging beam onto a substrate having a sensitized surface so as to imprint the reticle pattern onto the sensitized surface. The illumination-optical system comprises an electron gun having an electron-emission surface configured to have an annular profile about the optical axis. Thus, the imaging beam is shaped at the contrast aperture to have an intensity distribution in which beam intensity on the optical axis is less than off-axis beam intensity.

The annular electron-emission surface conveniently is defined on the cathode by a "defining region" typically made of a different material than the electron-emission surface. To such end, the annular region and the defining region desirably have respective work functions that are sufficiently different from each other that electrons are emitted by the annular region but not from the defining region.

The electron gun can be a type that forms a gun crossover, wherein the illumination-optical system illuminates the exposure unit with an enlarged image of the gun crossover.

The projection-optical system desirably comprises first and second projection lenses, wherein the contrast aperture is situated axially between the first and second projection lenses. The contrast aperture can be, for example, annular or circular. A transverse profile of the illumination beam on the contrast aperture can be controllable.

The illumination-optical system desirably comprises first and second condenser lenses and a beam-shaping aperture situated axially between the first and second condenser lenses. Alternatively, the beam-shaping aperture is situated in the projection-optical system. The beam-shaping aperture can be annular, and desirably is situated so as to be conjugate with the contrast aperture.

The apparatus can include a field-limiting aperture situated upstream of the reticle. In such an instance, the illumination-optical system can comprise first and second lenses situated between the CPB source and the field-limiting aperture.

According to another aspect of the invention, electron-beam microlithography apparatus are provided for performing projection-transfer of a pattern (defined by a reticle) to a substrate. A representative embodiment of such an apparatus comprises, along an optical axis, an illumination-optical system and a projection-optical system. The illumination-optical system illuminates an exposure unit of the reticle with an illumination electron beam. (The exposure unit represents a respective portion of the reticle pattern to be transferred to the substrate.) The illumination-optical system comprises an electron gun including a cathode that has an annular-shaped electron-emissive surface. The projection-optical system projects an imaging electron beam (formed by passage of the illumination beam through the illuminated exposure unit of the reticle) onto the substrate. Thus, an image of the illuminated exposure unit is formed on the substrate.

In the foregoing embodiment, it is preferred that at least a portion of the illumination beam have substantially uniform intensity distribution in the vicinity of the crossover formed by the electron gun. Such a beam desirably is imaged in a plane that is optically conjugate to the reticle.

Because the portion of the reticle receiving a substantially uniform flux is relatively large in diameter, a larger exposure area can be accommodated. Also, the portion of the electron beam that is not used for exposure is correspondingly reduced. This enables the power supply for the electron gun to be reduced in size and output, and reduces the cooling load of the microlithography apparatus. The "substantially uniform intensity distribution" referred to above corresponds, according to one example described herein, to an intensity distribution exhibiting a variation in current density of no more than ±1 % from the peak value. In addition, except for cathode/reticle image portions, the illumination beam and imaging beam are hollow beams, which reduces the influence of space-charge effects.

The electron gun desirably forms a gun crossover, wherein the portion of the illumination beam having a substantially uniform intensity distribution (and that is situated at or in the vicinity of the gun crossover) is imaged in a plane that is optically conjugate to the reticle. A portion of the illumination beam having a uniform intensity distribution at (or in the vicinity of) the gun crossover can be imaged either on the reticle or on a plane that is optically conjugate to the reticle.

The annular-shaped electron-emissive surface can be defined by surrounding material ("defining region") on the cathode. The electron-emissive surface desirably has a work function that is at least 0.6 eV less than a work function of the defining region. With such a difference in work function, the illumination beam is emitted substantially only from the annular electron-emissive surface, to thereby produce a hollow illumination beam. Also, the illumination beam can be provided with the required brightness without having to use a large electron-gun current. By way of example, the electron-emissive surface can be relatively small (e.g., 4 to 12 $mm^2$ area) compared to the surface of the cathode that is 8 mm in diameter.

The electron gun can comprise multiple electrodes including the cathode. Such a configuration can allow at least one of the following to be adjusted: (a) a location at which an image of the cathode is formed, and (b) a location at which a beam crossover is formed. The adjustment can be made by varying a voltage applied to at least one of the electrodes of the electron gun.

A power supply is connected to the cathode. The power supply can be adjustable to vary electrical power supplied to a heating element in the cathode. Thus, cathode temperature can be changed as required to change the brightness of the illumination beam.

The illumination-optical system can be configured to form multiple crossovers of the illumination beam at respective locations along the optical axis. In such a configuration, the crossover nearest the reticle is formed upstream of the reticle. The illumination-optical system can comprise multiple lenses and a field-limiting aperture. The field-limiting aperture can be adjustable to independently adjust one or more of an imaging condition and a magnification ratio of the illumination beam. Furthermore, the illumination-optical system can comprise a lens situated at a location at which an image of the cathode is formed. Such a lens is adjustable to allow independent adjustment of one or more of an imaging condition and a magnification ratio of the illumination beam.

The projection-optical system can comprise a contrast aperture, as summarized above, desirably situated at a position conjugate to the cathode. Placing the contrast aperture in a location that is conjugate to the cathode forms a hollow imaging beam without having to use a special beam-shading aperture. In a direction downstream of the contrast aperture, an image of the cathode can be formed before a crossover. A crossover can be formed between the contrast aperture and the substrate.

The foregoing and additional features and advantages of the invention will be more readily understood from the following detailed description, which proceeds with reference to the accompanying drawings.

DETAILED DESCRIPTION

The invention is described below in connection with multiple representative embodiments.

Figure 1:
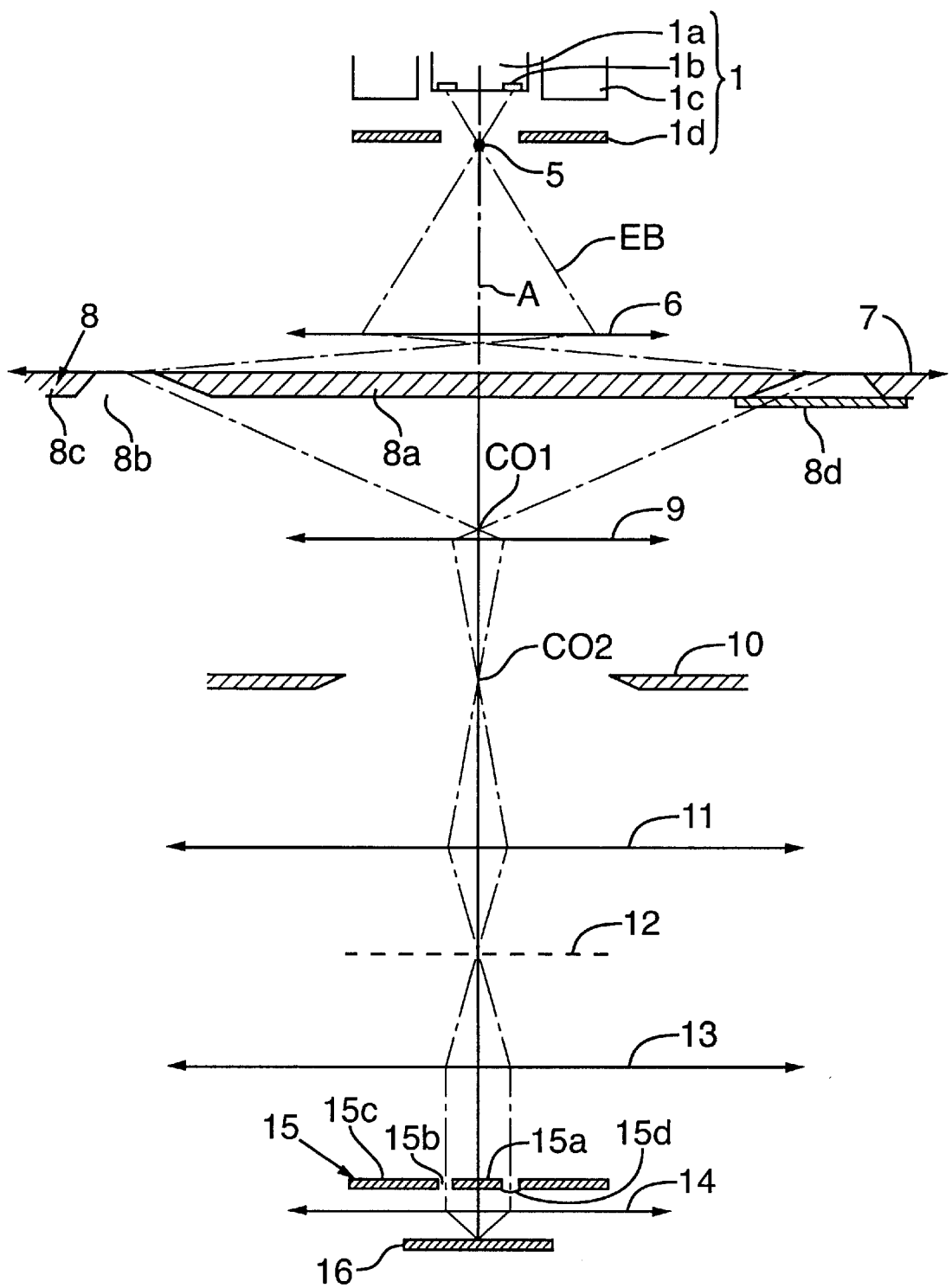
FIG. 1 schematically depicts a charged-particle-beam (CPB) microlithography apparatus according to a first representative embodiment of the invention, and also depicts certain imaging relationships in the apparatus.

A first representative embodiment is depicted in FIG. 1 that schematically shows certain imaging relationships associated with the embodiment. An electron beam EB (as an exemplary charged particle beam) is produced by an electron gun 1. The electron beam EB propagates downstream of the electron gun 1 along the optical axis A. The electron gun 1 in this embodiment comprises three electrodes: a cathode 1a (including an annular electron-emitting region 1b), a Wehnelt 1c, and an anode 1d. The cathode 1a desirably is made of a lanthanum hexaboride ($LaB_6$) monocrystalline rod approximately 4 to 8 mm in diameter. The annular electron-emitting region 1b is situated on the downstream-facing surface of the cathode 1a.

The entire downstream-facing surface of the cathode 1a, except the annular electron-emitting region 1b, desirably is coated with a "defining region" of, e.g., carbon or rhenium (to a thickness, e.g., of 100 nm as achieved by, e.g., sputtering) to allow electron emission only from the annular region 1b. In other words, the defining region defines the shape and dimensions of the annular region 1b. At a temperature greater than approximately 1000 K, $LaB_6$ reacts with most metals, causing corrosion of the $LaB_6$. However, $LaB_6$ does not react with carbon or rhenium. Also, because the work functions of carbon and rhenium are much higher than the work function of $LaB_6$ (about 2.5 eV), these elements emit substantially no electrons at temperatures lower than approximately 1500 K at which $LaB_6$ emits electrons. Therefore, only the annular region 1b emits electrons, and the resulting beam has a "hollow" transverse intensity profile.

A negative acceleration voltage (e.g., −100 KV) is applied to the cathode 1a. The anode 1d, which defines an axial aperture through which the electron beam EB passes, is normally at zero volts ("ground"). A negative voltage (e.g., −100.02 KV) is applied to the Wehnelt 1c, which forms a ring-shaped field around the cathode 1a. The Wehnelt 1c acts upon the electron beam EB emitted from the annular region 1b to urge the beam to propagate downstream along the optical axis A. The resulting hollow electron beam EB emitted from the electron gun 1 forms a gun crossover 5 immediately downstream of the anode 1d. ("Hollow" means that the beam has an intensity distribution in which beam intensity on the propagation axis of the beam is less than beam intensity off-axis.) The hollow beam exhibits substantially reduced space-charge effects compared to a beam produced by a conventional system. As summarized above, a conventional system employs an annular aperture, located between the electron gun and the reticle, for producing the desired quality of hollow beam. According to the embodiment described above, the gun itself generates the desired quality of hollow beam for illuminating the reticle.

Downstream of the electron gun 1 is an illumination-optical system. In the FIG. 1 embodiment, the illumination-optical system comprises first and second condenser lenses 6, 7, respectively, that collectively form a two-stage condenser lens. Co-positioned with the second condenser lens 7 is a beam-shaping aperture 8. The beam-shaping aperture 8 desirably comprises a round center plate 8a surrounded by an outer ring 8c. Thus, the center plate 8a and outer ring 8c define a circumferential gap therebetween configured as an annular aperture 8b. The center plate 8a can be supported as required at multiple locations around its circumference by support members 8d. The beam-shaping aperture 8 shapes the hollow electron beam EB to have a more uniform intensity around its propagation axis. Whereas, in conventional systems, an annular aperture located downstream of the electron gun blocks passage therethrough of most of the electron beam, the beam-shaping aperture 8 in this representative embodiment merely trims the beam and allows most of the beam to pass through. As a result, compared to conventional systems, a substantially lower beam-emission current can be used (which reduces space-charge effects) and the beam-shaping aperture 8 exhibits a much reduced rise in temperature.

The electron beam EB diverging from the gun crossover 5 is diverged even more by passage through the first condenser lens 6. The beam then passes through the second condenser lens 7 and the beam-shaping aperture 8. Downstream of the beam-shaping aperture 8, the beam forms a first crossover CO1 just upstream of a condenser lens 9 and a second crossover CO2 at a field-limiting aperture 10.

The field-limiting aperture 10 trims the outer edge of the illumination beam as required so as to illuminate a desired exposure unit on a downstream reticle 12. A condenser lens 11 forms an image of the field-limiting aperture 10 on the selected exposure unit of the reticle 12.

The size of the second crossover CO2 can be controlled by changing the "magnification" factor by a "zoom" adjustment of the condenser lenses 7 and 9. Because an image of the second crossover CO2 is illuminated onto the reticle 12, illumination can be made uniform over the entire selected exposure unit even when the beam-current density as emitted from the cathode 1a is not uniform. I.e., at the crossover CO2, the beam currents emitted from different loci on the cathode converge and are averaged, resulting in a Köhler-like illumination of the reticle. Also, because the cathode 1a is operated under temperature-limited conditions, beam brightness as illuminated on the selected exposure unit can be adjusted by adjusting the cathode temperature. (In a "temperature-limited" condition, the emission current is controlled by the temperature of the emission surface rather than electrode potential.)

Although not shown in FIG. 1, a selection deflector is situated downstream of the field-limiting aperture 10. The selection deflector sequentially scans the illumination beam primarily in the horizontal direction (in the figure) so as to achieve sequential illumination of all the exposure units of the reticle 12 within the field of the illumination-optical system. In addition, the reticle 12 and substrate 1 6 are mounted individually on respective stages (not shown) that are moved in a scanning manner as required in the horizontal direction (in the figure) to increase the lateral range of exposure to a width wider than the field of the optical system of the apparatus.

Situated downstream of the reticle 12 is a projection-optical system that, in the FIG. 1 embodiment, comprises first and second projection lenses (objective lenses) 13, 14, respectively, a contrast aperture 15, and a deflector (not shown). As discussed above, the exposure units on the reticle 12 are illuminated individually and sequential by the illumination beam. As each exposure unit is illuminated, the resulting imaging beam acquires an ability to form an image of the illuminated exposure unit. As the imaging beam passes through the projection lenses 13, 14, the imaging beam is demagnified and caused to form an image of the illuminated exposure unit at the proper location on the substrate 16. (As used herein, "demagnified" means that the image formed on the substrate 16 is smaller than the corresponding illuminated exposure unit by a pre-determined "demagnification ratio.") The substrate 16 (e.g., a semiconductor wafer) is coated with an appropriate resist that is sensitive to a dosage of the electron beam such that the images of the illuminated exposure units are imprinted on the substrate.

The contrast aperture 15 is situated between the first and second projection lenses 13, 14. Thus, the contrast aperture 15 effectively divides the axial distance between the projection lenses 13, 14 according to the demagnification ratio. The contrast aperture 15 is situated in a plane that is optically conjugate with the plane of the cathode surface. The contrast aperture 15 desirably comprises a round center plate 15a surrounded by an outer ring 15c so as to define a circumferential gap (annular aperture 15b) therebetween. The annular aperture 15b desirably extends from 8 mrad (inside radius) to 10 mrad (outside radius) relative to a point on the optical axis A corresponding to the plane of the first projection lens 13. The center plate 15 a can be supported peripherally using support members 15d.

The contrast aperture 15 functions, inter alia, as a shield to block non-patterned portions of the imaging beam (i.e., electrons scattered by the reticle 12) from reaching the substrate 16. The contrast aperture 15 is desirably annular in view of the annular emission surface 1b of the cathode 1a. Hence, the contrast aperture 15 efficiently removes scattered electrons. In conventional systems, in contrast, an annular scattering aperture is not used (although an open round aperture is sometimes used, which is much less effective with a hollow beam).

The embodiment shown in FIG. 1 and described above provides an electron-beam microlithography system in which image blur due to space-charge effects are reduced. This allows microlithographic pattern transfer to be performed with greater accuracy and throughput than achieved with conventional systems.

According to the invention, even though the electron beam is not emitted from the center of the cathode 1a, the beam as emitted from the electron gun 1 exhibits a simple Gaussian intensity distribution at crossovers (with a center maximum intensity located on the axis A). However, as viewed within respective successive planes axially displaced from the crossover, the transverse intensity profile of the beam is the sum of multiple component Gaussian distributions. Each component Gaussian distribution has a respective peak intensity at a respective radial distance from the optical axis.

Figure 2:
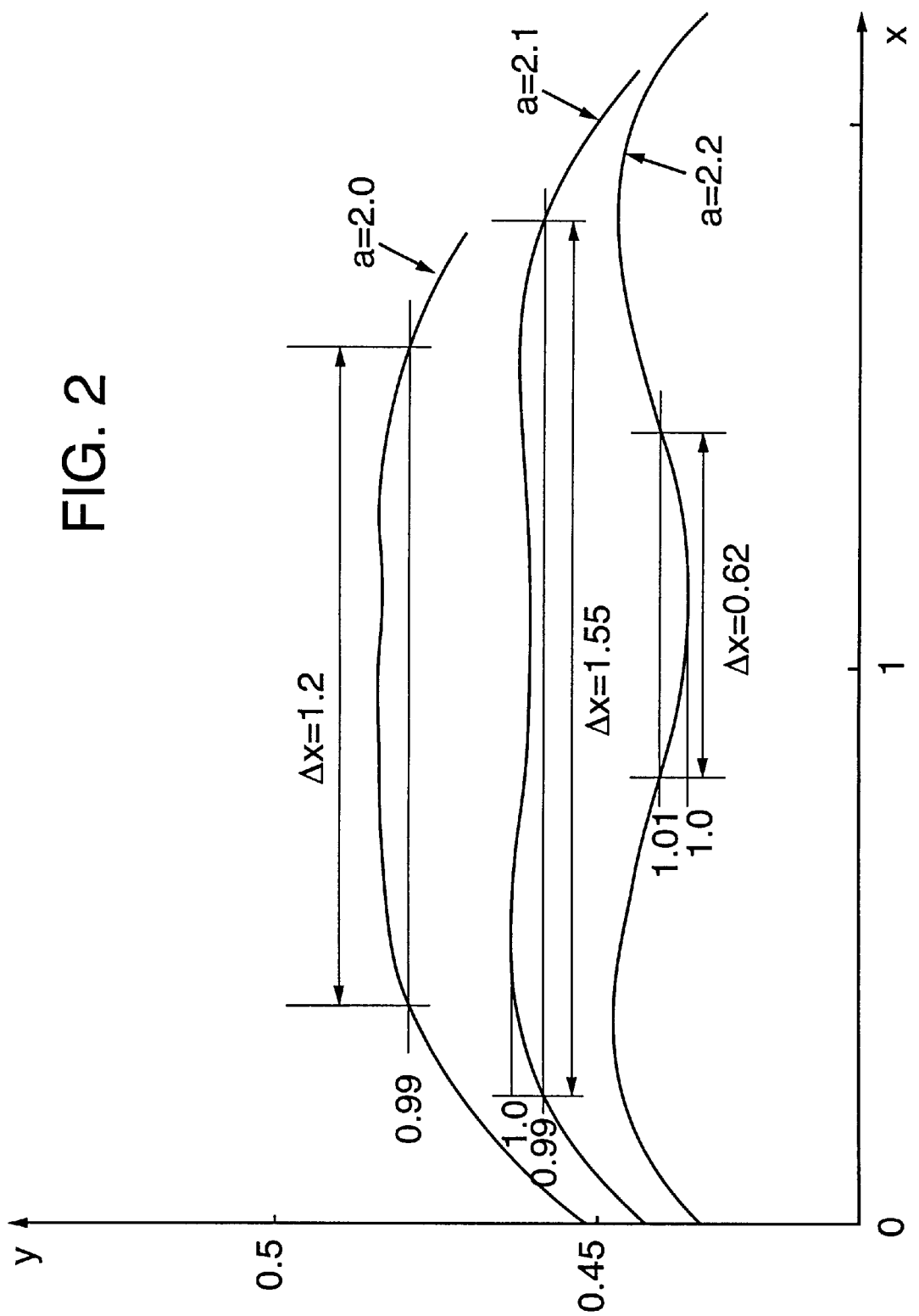
FIG. 2 includes plots showing the peak portions of transverse beam-intensity distributions for respective pairs of Gaussian distributions having the same intensity at the same instant in time but separated from each other along the optical axis.

Representative transverse intensity distributions were calculated, and peak portions of the resulting distributions are plotted in FIG. 2. (In FIG. 2, the abscissa is lateral position wherein "1" is the optical axis and the ordinate is "y" calculated using Equation (1) below.)

The distribution for two Gaussian distributions having the same intensity but having respective peaks separated from each other by a given distance "a" in a radial direction from the optical axis, is given by Equation (1):

$$y = \frac{1}{\sqrt{2\pi}} \left[ \exp\left(-\frac{x^2}{2}\right) + \exp\left(-\frac{(x+a)^2}{2}\right) \right] \quad (1)$$

Respective plots for three different values of "a" are shown in FIG. 2 (i.e., a=2.0, 2.1, and 2.2, respectively), wherein "a" has the same units as "x". In FIG. 2, $\Delta x$ represents the range of x over which, in the central portion of the overall intensity distribution, the intensity is within ±1 % of the central value. For a value of a=0 (i.e., where the distribution is strictly Gaussian, not shown), the value of $\Delta x$ is 0.282. In comparison, $\Delta x$=1.2 for a=2.0 (the top curve in the figure), $\Delta x$=1.55 for a=2.1 (the middle curve), and $\Delta x$=0.62 for a=2.2 (the lower curve). All three of these values of "a" provide a wider lateral uniform beam intensity than provided when a=0. For example, at a=2.1, the value of $\Delta X$ is increased by a factor of 5.5 over the value of $\Delta x$ at a=0. This represents a substantial increase in the size of the region of uniform beam-intensity distribution. These results are achieved by the combination, in FIG. 1, of items 1 and 6–11.

According to the above, a uniform high-intensity electron beam is obtained that is transversely wider than obtained from prior-art apparatus. The wider beam is produced by combining particles from the beam originating from multiple locations within a ring-shaped electron-emission source.

Figure 3:
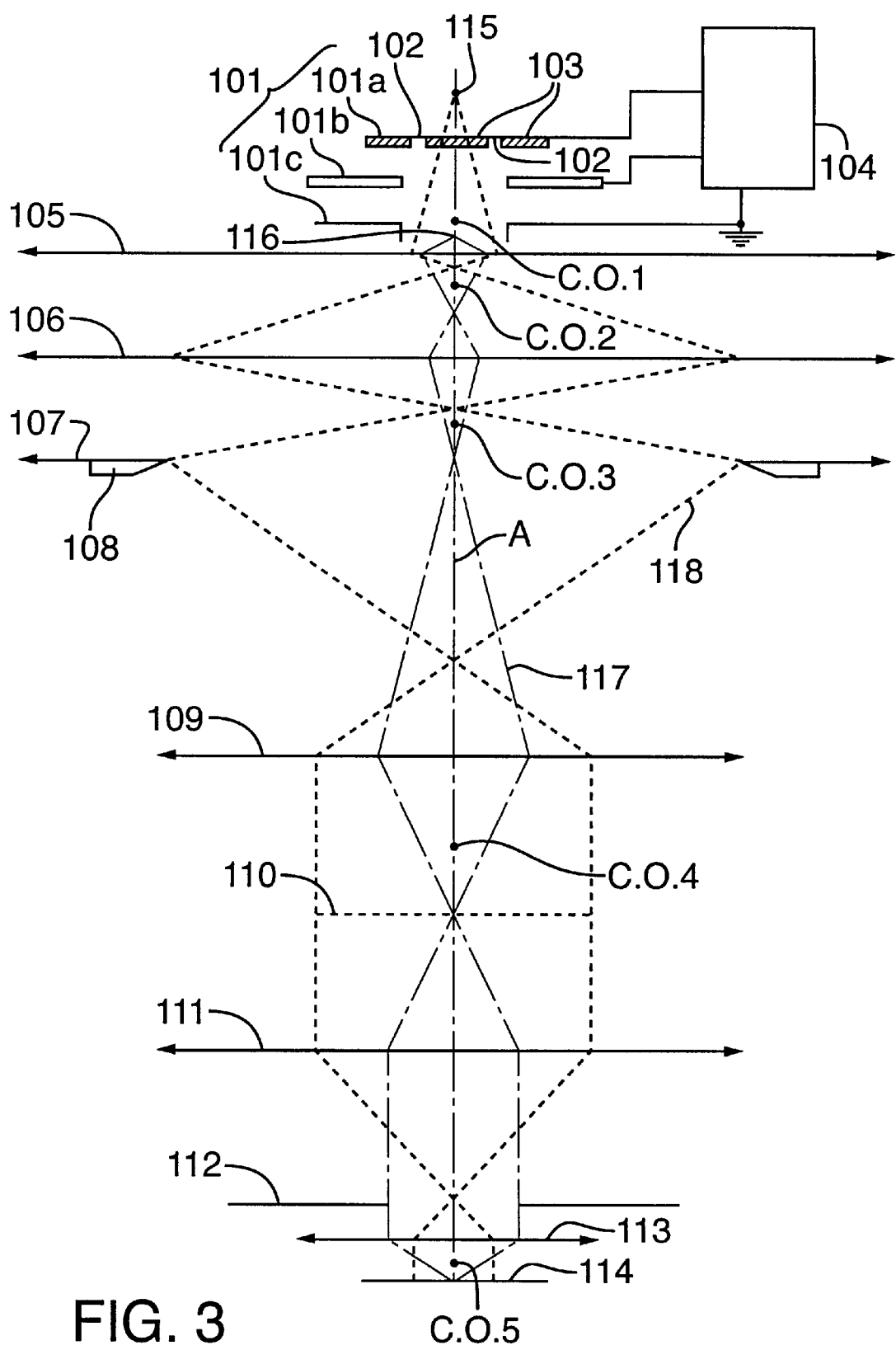
FIG. 3 schematically depicts a CPB microlithography apparatus according to a second representative embodiment, and also depicts certain imaging relationships in the apparatus.

FIG. 3 depicts the overall configuration and certain imaging relationships of a second representative embodiment of an electron-beam microlithography system according to the invention. The electron beam is produced by an electron gun 101 situated at the most upstream location in the system. The electron beam propagates from the electron gun 101 in a downstream direction along an optical axis A.

The electron gun 101 comprises three electrodes: a cathode 101a, a first (or control) anode 10b, and a second anode 101c. The cathode 101a comprises a plate (desirably made of hafnium (Hf) and, by way of example, 12 mm in diameter). Except for an annular (ring-shaped) exposed region 102, the cathode 101a has a surficial coating 103 of an element such as iridium (Ir). The coating 103 serves as a "defining region" that defines the annular exposed region 102. The work function of Hf is 3.6 eV, and that of Ir is 5.3 eV (providing a work-function difference of 1.7 eV). Therefore, during operation of the electron gun 101, electrons are emitted essentially only from the annular region 102 of the cathode 101a because the annular region 102 is not coated. Hence, the annular region 102 is the electron-emissive surface of the cathode 101a. By way of example, the annular region 102 is 2 mm wide and has an outer diameter of 10 mm.

As an alternative to the coating 103 being a defining region, the annular region 102 can be layered onto the layer 103.

During operation, a negative voltage (e.g., −100 KV) is applied by a power supply 104 to the cathode 101a. The second-anode 101c, which defines a center aperture through which the electron beam passes, is normally at 0 V ("ground"), as controlled by the power supply 104. The control anode 101b, having a configuration similar to that of the second anode 101c, is situated between the cathode 101a and the second anode 101c. In this example, a negative voltage (e.g., −82 KV) is applied to the control anode 101b by the power supply 104. The electron gun 101 emits a "hollow" electron beam from the annular region 102. According to simulation studies, and by way of example, a virtual image of the cathode 101a (i.e., of the annular region 102 ) is formed at an axial position 115 located 63 mm upstream of the cathode 101a. An image of the cathode is formed at an axial location denoted "C.O.1" situated 185 mm downstream of the cathode 101a.

Situated downstream of the electron gun 101 is an illumination-optical system. The illumination-optical system comprises a four-stage condenser-lens assembly including the condenser lenses 105, 106, 107, and 109. A field-limiting aperture 108 is situated at the same axial position as the third condenser lens 107. By way of example, the first (most upstream) condenser lens 105 is situated 200 mm from the cathode 101a. The field-limiting aperture 108 is used to define the outer (peripheral) profile of the illumination beam. An image of the field-limiting aperture 108, as formed on the reticle 110, encompasses one exposure unit (e.g., a subfield) of the pattern defined on the reticle 110. The dimensions of the image of the cathode 101a at the field-limiting aperture 108 are controlled by the magnification imparted to the beam by the condenser lenses 105, 106 that act concertedly in a "zoom" manner.

Situated downstream of the field-limiting aperture 108 is a selection deflector (not shown). The selection deflector scans the illumination beam to individually illuminate the exposure units of the reticle 110 in a sequential manner. Such scanning is primarily within a defined range (corresponding to the optical field of the illumination-optical system) in the horizontal (left-right) direction in the figure. To extend the scanning range beyond the optical field, each of the reticle 110 and substrate 114 are individually mounted on respective movable stages (not shown).

In FIG. 3, although only one exposure unit on the reticle 110 is shown, it will be understood that the reticle 110 extends further in a plane perpendicular to the optical axis A and typically includes a large number of exposure units.

Situated downstream of the reticle 110 is a projection-optical system. The projection-optical system comprises first and second projection lenses 111 and 113, a contrast aperture 112, and a deflector (not shown). As each exposure unit on the reticle 110 is illuminated by the electron beam (i.e., by the illumination beam) the resulting imaging beam is deflected by the deflector and demagnifyingly projected by the projection lenses 111, 113 to form an image of the illuminated exposure unit at a prescribed location on the substrate 114. The deflector downstream of the second projection lens 113 adjusts the lateral position of the imaging beam so that the image of the illuminated exposure unit is formed at the desired location on the substrate 114. The substrate 114 is surficially coated with an appropriate resist so as to be imprinted with the respective images of the illuminated exposure units if exposed with a sufficient dosage of electrons.

The contrast aperture 112 is situated between the projection lenses 111, 113 in an axial location that effectively divides the axial distance between the projection lenses 111, 113 proportionately to the demagnification ratio. Thus, the contrast aperture 112 is situated in a plane that is optically conjugate to the field-limiting aperture 108 described above. The contrast aperture 112 has a profile that is a geometric analog of an exposure unit on the reticle 110. Thus, the contrast aperture 112 acts as a shield that blocks non-patterned portions of the imaging beam (i.e., electrons scattered by the reticle 110 ) from reaching the substrate 114.

In FIG. 3, regions in which the transverse beam-intensity distribution is essentially uniform are located within the area bounded by the dot-dash lines 117, and regions in which an image of the cathode 101a can be formed are located within the area bounded by the dashed lines 118. The uniform-distribution regions are located on both sides of each of respective crossovers C.O.1–C.O.5. Since a crossover is a location where space-charge effects are greatest, it is desirable that the crossover C.O.5 be located relatively near the substrate 114. That is, the beam current at the crossover C.O.4 is higher than at the crossover C.O.5 because, at C.O.5, the beam does not include scattered electrons blocked by the contrast aperture 112. It is important to reduce space-charge effects in a beam about to be incident on the substrate 114. Also, the FIG.- 3 system is configured so that a uniform beam-intensity distribution desirably occurs at an object position 116 of the condenser lens 105.

The field-limiting aperture 108, configured to allow the electron beam to illuminate only one exposure unit at a time on the reticle 110, is situated at the same axial location as the condenser lens 107. In this illumination-optical system, the principal plane of the condenser lens 107 is optically conjugate to the imaging-location 116 at which the transverse intensity distribution of the beam is uniform. As a result, changes in beam intensity at the condenser lens 107 do not affect imaging conditions at the imaging location 116.

The location of the image of the crossover C.O.1 can be changed by changing the voltage applied to the control anode 101b. This makes it possible to adjust the imaging conditions without changing the lens conditions.

Therefore, an electron-beam microlithography system is provided that can illuminate a larger exposure unit using an electron beam produced by an electron gun having lower emittance than achievable with conventional electron-beam microlithography systems. Consequently, image degradation due to space-charge effects is reduced compared to conventional systems.

Figure 4:
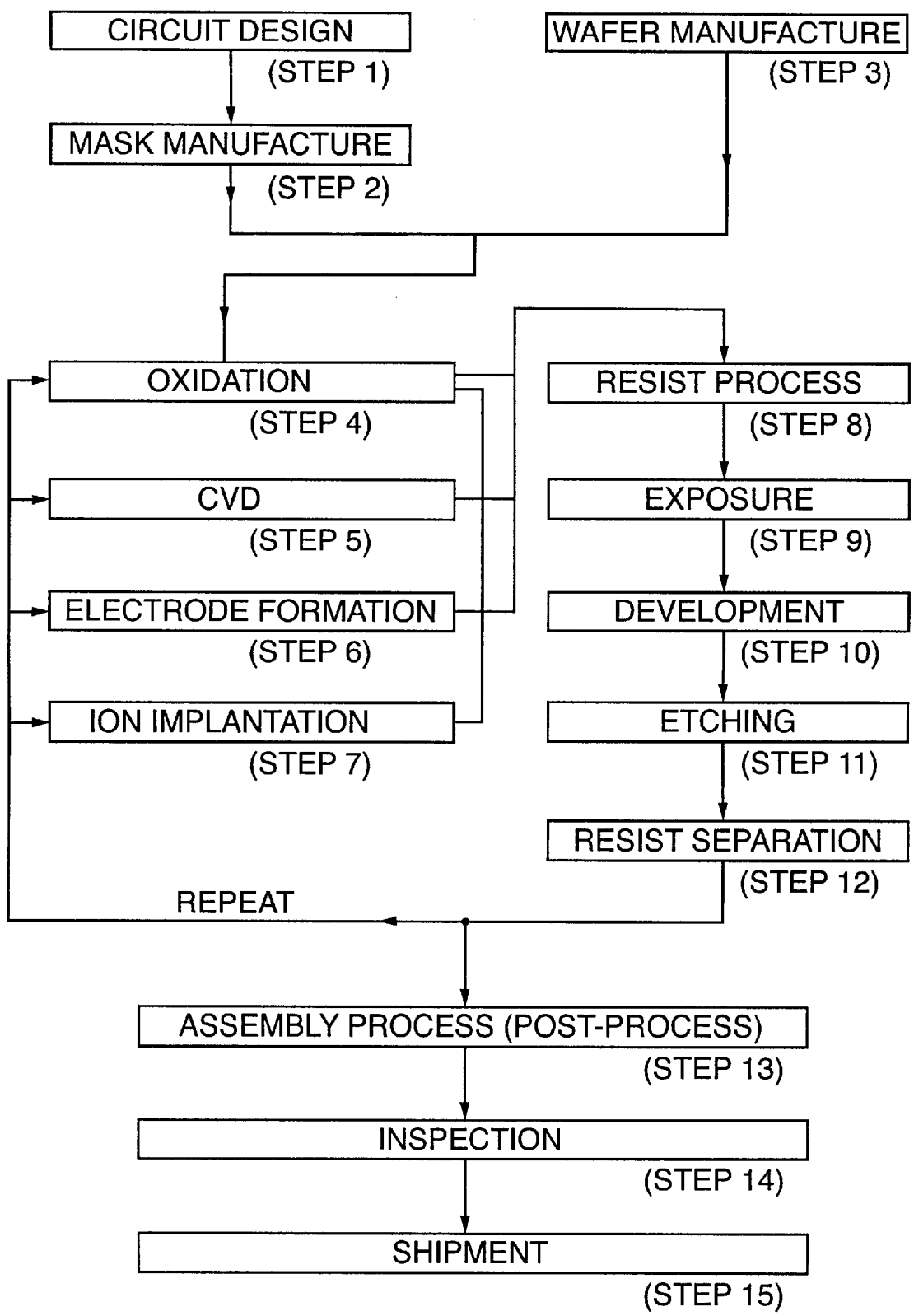
FIG. 4 is a block diagram of a device fabrication process.

FIG. 4 is a flow chart of steps in a process for manufacturing a semiconductor device such as a semiconductor chip (e.g., an integrated circuit or LSI device), a display panel (e.g., liquid-crystal panel), or CCD, for example. In step 1, the circuit for the device is designed. In step 2, a reticle ("mask") for the circuit is manufactured. In step 3, a wafer is manufactured from a material such as silicon.

Steps 4–12 are directed to wafer-processing steps, specifically "pre-process" steps. In the pre-process steps, the circuit pattern defined on the reticle is transferred onto the wafer by microlithography. Step 13 is an assembly step (also termed a "post-process" step) in which the wafer that has passed through steps 4–12 is formed into semiconductor chips. This step can include, e.g., assembling the devices (dicing and bonding) and packaging (encapsulation of individual chips). Step 14 is an inspection step in which any of various operability and qualification tests of the devices produced in step 13 are conducted. Afterward, devices that successfully pass step 14 are finished, packaged, and shipped (step 15).

Steps 4–12 also provide details of wafer processing. Step 4 is an oxidation step for oxidizing the surface of a wafer. Step 5 involves chemical vapor deposition (CVD) for forming an insulating film on the wafer surface. Step 6 is an electrode-forming step for forming electrodes on the wafer (typically by vapor deposition). Step 7 is an ion-implantation step for implanting ions (e.g., dopant ions) into the wafer. Step 8 involves application of a resist (exposure-sensitive material) to the wafer. Step 9 involves microlithographically exposing the resist so as to imprint the resist with the reticle pattern, as described elsewhere herein. Step 10 involves developing the exposed resist on the wafer. Step 11 involves etching the wafer to remove material from areas where developed resist is absent. Step 12 involves resist separation, in which remaining resist on the wafer is removed after the etching step. By repeating steps 4–12 as required, circuit patterns as defined by successive reticles are formed superposedly on the wafer.

Whereas the invention has been described in connection with multiple representative embodiments, it will be understood that the invention is not limited to those embodiments. On the contrary, the invention is intended to encompass all alternatives, modifications, and equivalents as may be included within the spirit and scope of the invention as defined by the appended claims.

What is claim is:

1. An apparatus for performing a microlithographic transfer of a pattern, defined by a reticle, to a substrate using an electron beam, the apparatus comprising along an optical axis:
   (a) an illumination-optical system situated and configured to direct an electron illumination beam to the reticle so as to illuminate an exposure unit of the reticle with the illumination beam and form an imaging beam from electrons of the illumination beam passing through the illuminated exposure unit;
   (b) a projection-optical system situated downstream of the illumination optical system and configured to project the imaging beam onto a substrate having a sensitized surface so as to imprint the reticle pattern onto the sensitized surface, the projection-optical system comprising a contrast aperture; and
   (c) the illumination-optical system comprising an electron gun having an electron-emission surface configured so as to shape the imaging beam at the contrast aperture to have an intensity distribution in which beam intensity on the optical axis is less than off-axis beam intensity, wherein the electron gun forms a gun crossover and the illumination-optical system illuminates the exposure unit with an enlarged image of the gun crossover.

2. The apparatus of claim 1, wherein:
   the electron gun comprises a cathode comprising an annular electron-emission surface; and
   the annular electron-emission surface is defined by a defining region, the annular electron-emission surface and the defining region having respective work functions that are sufficiently different from each other that electrons are emitted by the annular electron-emission surface but not from the defining region.

3. The apparatus of claim 1, wherein the projection-optical system comprises first and second projection lenses and a contrast aperture situated axially between the first and second projection lenses.

4. The apparatus of claim 1, wherein the contrast aperture is annular.

5. The apparatus of claim 1, wherein the contrast aperture is circular.

6. An electron-beam microlithography apparatus for performing a projection-transfer of a pattern, defined by a reticle, to a substrate, the apparatus comprising along an optical axis:
   (a) an illumination-optical system situated and configured to illuminate an exposure unit of the reticle with an illumination electron beam, the exposure unit representing a respective portion of the pattern, defined by the reticle, to be transferred to the substrate;
   (b) a projection-optical system situated and configured to projection-image, on the substrate, an imaging electron beam formed by passage of the illumination beam through the illuminated exposure unit of the reticle; and
   (c) the illumination-optical system comprising an electron gun including a cathode having an annular-shaped electron-emissive surface, wherein the electron gun forms a gun crossover, and a portion of the illumination beam that is of substantially uniform intensity distribution, and that is situated in the vicinity of the gun crossover, is imaged in a plane that is optically conjugate to the reticle.

7. The apparatus of claim 6, wherein the projection-optical system comprises a contrast aperture situated at a position conjugate to the cathode.

8. The apparatus of claim 6, wherein a portion of the illumination beam having a uniform intensity distribution at the gun crossover is imaged either on the reticle or on a plane that is optically conjugate to the reticle.

9. The apparatus of claim 6, wherein:
   the electron beam between the electron gun and the reticle forms multiple crossovers at respective locations along the optical axis, and;
   the crossover nearest the reticle is formed upstream of the reticle.

10. The apparatus of claim 6, further comprising a contrast aperture situated at a location conjugate to the cathode.

11. The apparatus of claim 6, wherein the illumination-optical system further comprises a field-limiting aperture that is adjustable to independently vary one or more of an imaging condition and a magnification ratio.

12. The apparatus of claim 6, wherein the illumination-optical system further comprises a lens situated at a location at which an image of the cathode is formed, the lens being adjustable to independently vary one or more of an imaging condition and a magnification ratio.

13. The apparatus of claim 6, wherein the annular-shaped electron-emissive surface is defined by surrounding material on the cathode, the electron-emissive surface having a work function that is at least 0.6 eV less than a work function of the surrounding material.

14. The apparatus of claim 6, wherein:
   the electron gun comprises multiple electrodes including the cathode; and at least one of (i) a location at which an image of the cathode is formed by the illumination-optical system and (ii) a location at which a beam crossover is formed is adjustable by varying a voltage applied to at least one of the electrodes of the electron gun.

15. The apparatus of claim 6, further comprising a power supply connected to the cathode, the power supply being adjustable to vary electrical power supplied to the cathode and thus vary cathode temperature so as to adjust brightness of the illumination beam.

16. An electron-beam microlithography apparatus for performing a projection-transfer of a pattern, defined by a reticle, to a substrate, the apparatus comprising along an optical axis:

(a) an illumination-optical system situated and configured to illuminate an exposure unit of the reticle with an illumination electron beam, the exposure unit representing a respective portion of the pattern, defined by the reticle, to be transferred to the substrate;

(b) a projection-optical system situated and configured to projection-image, on the substrate, an imaging electron beam formed by passage of the illumination beam through the illuminated exposure unit of the reticle;

(c) the illumination-optical system comprising an electron gun including a cathode having an annular-shaped electron-emissive surface; and (d) a contrast aperture situated at a location conjugate to the cathode.

* * * * *

UNITED STATES PATENT AND TRADEMARK OFFICE
CERTIFICATE OF CORRECTION

PATENT NO. : 6,218,676 B1
DATED : April 17, 2001
INVENTOR(S) : Mamoru Nakasuji

Page 1 of 1

It is certified that error appears in the above-identified patent and that said Letters Patent is hereby corrected as shown below:

Column 4,
Line 8, change "have substantially" to -- have a substantially --

Column 7,
Line 16, change "1 6" to -- 16 --
Line 27, change "sequential" to -- sequentially --

Column 9,
Line 55, change "individually mounted" to -- mounted individually --

Signed and Sealed this

Second Day of April, 2002

Attest:

JAMES E. ROGAN
Attesting Officer
Director of the United States Patent and Trademark Office